United States Patent
Hwang et al.

(10) Patent No.: US 9,438,273 B2
(45) Date of Patent: Sep. 6, 2016

(54) METHOD FOR GENERATING FORWARD ERROR CORRECTION PACKET IN MULTIMEDIA SYSTEM AND METHOD AND APPARATUS FOR TRANSMITTING AND RECEIVING FORWARD ERROR CORRECTION PACKET

(71) Applicants: Sung-Hee Hwang, Suwon-si (KR);
Sung-Oh Hwang, Yongin-si (KR);
Seho Myung, Suwon-si (KR);
Hyun-Koo Yang, Seoul (KR);
Kyung-Mo Park, Seoul (KR)

(72) Inventors: Sung-Hee Hwang, Suwon-si (KR);
Sung-Oh Hwang, Yongin-si (KR);
Seho Myung, Suwon-si (KR);
Hyun-Koo Yang, Seoul (KR);
Kyung-Mo Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 14/313,353

(22) Filed: Jun. 24, 2014

(65) Prior Publication Data
US 2014/0310579 A1    Oct. 16, 2014

Related U.S. Application Data

(63) Continuation of application No. 13/543,279, filed on Jul. 6, 2012, now Pat. No. 8,769,369.

(30) Foreign Application Priority Data

Jul. 8, 2011   (KR) .................. 10-2011-0068098

(51) Int. Cl.
*H03M 13/00*   (2006.01)
*H04L 1/00*    (2006.01)
(Continued)

(52) U.S. Cl.
CPC ............. *H03M 13/03* (2013.01); *H03M 13/05* (2013.01); *H03M 13/373* (2013.01); *H04L 1/004* (2013.01);
(Continued)

(58) Field of Classification Search
CPC ............... H03M 13/03; H03M 13/05; H03M 13/2906; H04L 1/0041; H04L 1/0061; H04L 1/008; H04L 2/004; H04L 1/0083
USPC ........................................................ 714/752
See application file for complete search history.

(56) References Cited

U.S. PATENT DOCUMENTS 7,447,978 B2    11/2008  Hannuksela
7,971,129 B2 *   6/2011  Watson et al. ................ 714/784
(Continued)

FOREIGN PATENT DOCUMENTS

CN    101877620 A    11/2010
CN    1813425 B      6/2011
(Continued)

OTHER PUBLICATIONS

DVB Organization, 2007_02-07_DVBSSP.pdf., DVB, Digital Video Broadcasting, Feb. 13, 2007, XP017813605, Geneva, Switzerland.

*Primary Examiner* — Shelly A Chase
(74) *Attorney, Agent, or Firm* — Jefferson IP Law, LLP

(57) ABSTRACT

A method and apparatus for transmitting a Forward Error Correction (FEC) packet block including a plurality of FEC packets in a multimedia system are provided. The method includes generating a plurality of first FEC packet blocks by performing a first FEC encoding on a plurality of source symbols, each of the plurality of first FEC packet blocks including at least one source packet and at least one repair packet for repair of each of the at least one source packet, generating a second FEC packet block by performing a second FEC encoding on the plurality of first FEC packet blocks, the second FEC packet block including at least one repair packet for the plurality of first FEC packet blocks, and transmitting the second FEC packet block that includes, in header information of each of the at least one source packet and the at least one repair packet.

4 Claims, 4 Drawing Sheets

(51) Int. Cl.
  *H03M 13/03* (2006.01)
  *H03M 13/05* (2006.01)
  *H03M 13/37* (2006.01)
(52) U.S. Cl.
  CPC ............ *H04L 1/008* (2013.01); *H04L 1/0041* (2013.01); *H04L 1/0061* (2013.01); *H04L 1/0065* (2013.01); *H04L 1/0075* (2013.01); *H04L 1/0083* (2013.01); *H03M 13/6547* (2013.01)

(56) References Cited

U.S. PATENT DOCUMENTS

| | | |
|---|---|---|
| 8,473,821 B2 | 6/2013 | Taghavi Nasrabadi et al. |
| 2005/0002416 A1 | 1/2005 | Belotserkovsky et al. |
| 2005/0166123 A1 | 7/2005 | Yanamoto et al. |
| 2007/0124651 A1 | 5/2007 | Champel |
| 2007/0300127 A1 | 12/2007 | Watson et al. |
| 2007/0300134 A1 | 12/2007 | Sugai et al. |
| 2008/0151776 A1 | 6/2008 | Kure |
| 2009/0193318 A1 | 7/2009 | Schoenblum |
| 2010/0050057 A1 | 2/2010 | Luby |
| 2011/0099449 A1 | 4/2011 | Li et al. |

FOREIGN PATENT DOCUMENTS

| | | |
|---|---|---|
| JP | 3254240 B2 | 2/2002 |
| JP | 2005-323171 A | 11/2005 |
| JP | 2007-509557 A | 4/2007 |
| JP | 2011-503947 A | 1/2011 |
| KR | 10-2005-0076693 A | 7/2005 |
| KR | 10-2008-0059508 A | 6/2008 |
| WO | 2006/061902 A1 | 6/2006 |

\* cited by examiner

METHOD FOR GENERATING FORWARD ERROR CORRECTION PACKET IN MULTIMEDIA SYSTEM AND METHOD AND APPARATUS FOR TRANSMITTING AND RECEIVING FORWARD ERROR CORRECTION PACKET

PRIORITY

This application is a continuation of prior application Ser. No. 13/543,279, filed on Jul. 6, 2012, which claimed the benefit under 35 U.S.C. §119(a) of a Korean Patent Application filed in the Korean Industrial Property Office on Jul. 8, 2011 and assigned Serial No. 10-2011-0068098, the entire disclosure of which is hereby incorporated by reference.

BACKGROUND OF THE INVENTION

1. Field of the Invention

The present invention relates to a method for generating forward error correction packets in a multimedia system and a method and apparatus for transmitting and receiving forward error correction packets.

2. Description of the Related Art

Due to increasing types of content and increases in the number of high-volume or high-data content such as High Definition (HD) content and Ultra High Definition (UHD) content, data congestion is increasingly worse in communication networks.

FIG. 1 schematically shows general Internet Protocol (IP)-based network topology and data flow.

Referring to FIG. 1, due to the data congestion, content sent by a sender 110, which may be a host A, may not be fully delivered to a receiver 130, which may be host B, and some of the content may be lost in its route from the sender 110 to the receiver 130. In a typical IP network, data is transmitted on a packet basis, and thus, it may be lost on a transmission packet basis. Accordingly, the receiver 130 may not receive the transmission packet lost in the network, and thus may not find out data in the lost transmission packet, causing a variety of user inconveniences, including audio quality degradation, video quality degradation, screen cracks, missing subtitle information, and file loss.

Therefore, there is a need for a method for repairing or recovering data lost in the network. Accordingly, the sender 110 may generate Forward Error Correction (FEC) frames by FEC-encoding source data and adding repair data thereto, and may transmit the FEC frames through a series of processes. In an application layer of a protocol stack, unlike in a physical layer where transmission data is received in the transmission order, transmission data may not be received in the transmission order in the application layer as it passes through a plurality of routers 150 in the network. Thus, there is a need for an ordering method for allowing a receiver to determine the order of each of symbols in FEC frames and a packet generation and transmission method for allowing the receiver to get boundary information between FEC frames.

An IP packet 170, as shown in FIG. 1, may be transported to the receiver 130, passing through the plurality of routers 150. However, the IP packet 170 may be transported to the receiver 130 in a different order than the order that the sender 110 transmitted the packet 170. Accordingly, there is a need to indicate a transmission order of packets in Audio/Video (AV) content streaming. To this end, it is preferable that, in an application stage, data 171 in FIG. 1 may be regarded as RTP packet data that is generated by packetizing data compressed in an AV codec stage, using a Real Time Protocol (RTP), or may be regarded as Motion Picture Experts Group (MPEG) Media Transport (MMT) packet data.

SUMMARY OF THE INVENTION

An aspect of an exemplary embodiment of the present invention is to provide a method for generating Forward Error Correction (FEC) packets so as to prevent a packet loss in a multimedia system.

Another aspect of an exemplary embodiment of the present invention is to provide a method and apparatus for transmitting and receiving FEC packet blocks including FEC packets in a multimedia system.

In accordance with an aspect of the present invention, there is provided a method for transmitting a Forward Error Correction (FEC) packet block including a plurality of FEC packets in a multimedia system. The method includes generating a plurality of first FEC packet blocks by performing a first FEC encoding on a plurality of source symbols, each of the plurality of first FEC packet blocks including at least one source packet and at least one repair packet for repair of each of the at least one source packet; generating a second FEC packet block by performing a second FEC encoding on the plurality of first FEC packet blocks, the second FEC packet block including at least one repair packet for the plurality of first FEC packet blocks; and transmitting the second FEC packet block that includes, in header information of each of the at least one source packet and the at least one repair packet, at least one of first block boundary information for indicating a block boundary for the plurality of first FEC packet blocks and second block boundary information for indicating a block boundary for the second FEC packet block, and sequence number information for a related packet.

In accordance with another aspect of the present invention, there is provided a transmission apparatus for transmitting a FEC packet block including a plurality of FEC packets in a multimedia system. The transmission apparatus includes a transmitter for transmitting an FEC packet block according to a predetermined communication scheme; a first FEC encoder for generating a plurality of first FEC packet blocks by performing a first FEC encoding on a plurality of source symbols, each of the plurality of first FEC packet blocks including at least one source packet and at least one repair block for repair of each of the at least one source packet; a second FEC encoder for generating a second FEC packet block by performing a second FEC encoding on the plurality of first FEC packet blocks, the second FEC packet block including at least one repair packet for the plurality of first FEC packet blocks; and a controller for adding, to header information of each of the at least one source packet and the at least one repair packet, at least one of first block boundary information indicating a block boundary for the plurality of first FEC packet blocks and second block boundary information indicating a block boundary for the second FEC packet block, and sequence number information of a related packet, and for controlling transmission of each FEC packet block.

In accordance with yet another aspect of the present invention, there is provided a method for receiving a FEC packet block including a plurality of FEC packets in a multimedia system. The method includes receiving a plurality of packets constituting a plurality of first FEC packet blocks generated by performing a first FEC encoding on a plurality of source symbols, each of the plurality of first FEC packet blocks including at least one source packet and at least one repair packet for repair of each of the at least one source packet; receiving a plurality of packets constituting a second FEC packet block generated by performing a second FEC encoding on the plurality of first FEC packet blocks, the second FEC packet block including the plurality of first FEC packet blocks and at least one repair packet for the plurality of first FEC packet blocks; extracting header information from each of the received plurality of packets constituting the plurality of first FEC packet blocks or the second FEC packet block, determining a block boundary for the plurality of first FEC packet blocks and the second FEC packet block, and decoding each of the received plurality of packets; and repairing a lost source packet using a corresponding repair packet when there is a lost source packet as a result of the decoding. The header information of each packet includes at least one of first block boundary information indicating a block boundary for the plurality of first FEC packet blocks and second block boundary information indicating a block boundary for the second FEC packet block, and sequence number information of a related packet.

In accordance with yet another aspect of the present invention, there is provided a reception apparatus for receiving a FEC packet block including a plurality of FEC packets in a multimedia system. The reception apparatus includes a receiver for receiving a plurality of packets constituting a plurality of first FEC packet blocks generated by performing a first FEC encoding on a plurality of source symbols, each of the plurality of first FEC packet blocks including at least one source packet and at least one repair packet for repair of each source packet, and for receiving a plurality of packets constituting a second FEC packet block generated by performing a second FEC encoding on the plurality of first FEC packet blocks, the second FEC packet block including the plurality of first FEC packet blocks and at least one repair packet for the plurality of first FEC packet blocks; a decoder for performing decoding on at least one of the received plurality of first FEC packet blocks or second FEC packet block; and a controller for extracting header information from each of the received plurality of packets constituting the plurality of first FEC packet blocks or the second FEC packet block, for determining a block boundary for the plurality of first FEC packet blocks and the second FEC packet block, for decoding each packet using the decoder, and for repairing a lost source packet using a corresponding repair packet, when there is a lost source packet as a result of the decoding. The header information of each packet includes at least one of first block boundary information indicating a block boundary for the plurality of first FEC packet blocks and second block boundary information indicating a block boundary for the second FEC packet block, and sequence number information of a related packet.

BRIEF DESCRIPTION OF THE DRAWINGS

The above and other aspects, features and advantages of certain exemplary embodiments of the present invention will be more apparent from the following description taken in conjunction with the accompanying drawings, in which.

DETAILED DESCRIPTION OF EXEMPLARY EMBODIMENTS

Figure 1:
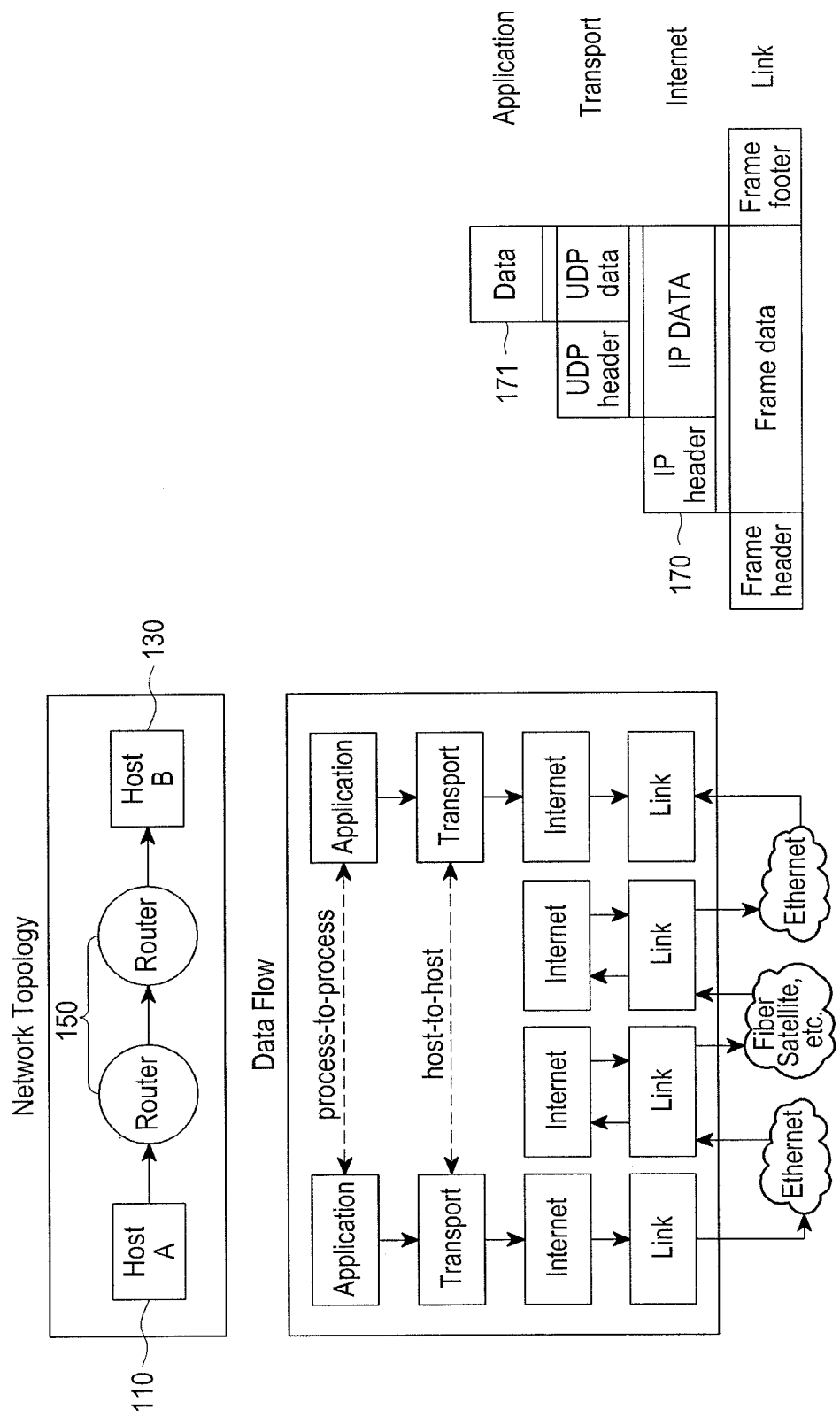
FIG. 1 schematically shows general Internet Protocol (IP)-based network topology and data flow.

Preferred embodiments of the present invention will now be described in detail with reference to the accompanying drawings. In the following description, specific details such as detailed configuration and components are merely provided to assist the overall understanding of exemplary embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

A below-described exemplary embodiment of the present invention includes a packet generation and transmission method for ordering and transmitting a plurality of Forward Error Correction (FEC) packets included in an FEC block, such as Real Time Protocol (RTP) packets or Motion Picture Experts Group (MPEG) Media Transport (MMT) packets, when FEC blocks are transmitted using a transport protocol. However, prior to a description of exemplary embodiments of the present invention, the terms used herein will be defined, in brief, as follows:

Forward Error Correction (FEC): an error-correcting code for correcting error or erasure symbols;

FEC Frame: a codeword generated by FEC-encoding information to be protected, the codeword including an information part and a parity or repair part;

Symbol: a unit of data, wherein a size in bits is referred to as a symbol size;

Source Symbol(s): an unprotected data symbol(s), which is an information part of an FEC frame;

Encoding Symbol(s): a symbol(s) generated by FEC-encoding a source symbol(s);

Repair Symbol(s): a parity part of an FEC frame generated by FEC-encoding a source symbol(s), wherein Encoding Symbols=Source Symbols+Repair Symbols, for Systematic Encoding where source symbols remain unchanged during FEC encoding;

Packet: a transmission unit including a header and a payload;

Payload: a piece of user data, which is to be transmitted from a sender and which is placed inside a packet;

Packet Header: a header of a packet;

Source Block: a set of symbols, which includes one or more source symbols;

Repair Block: a set of symbols, which includes one or more repair symbols;

FEC Block: a set of FEC frames, or a set of symbols, which includes a source block and a repair block;

FEC Packet: a packet for transmitting an FEC packet block;

Source Packet: a packet for transmitting a source block;

Repair Packet: a packet for transmitting a repair block; and

FEC Packet Block: a set of packets for transmitting an FEC packet block.

The source packet is a packet for transmitting a source block, which is a set of a plurality of source symbols. The repair packet is a packet for transmitting a repair block, which is a set of a plurality of repair symbols. The FEC block includes the source block and the repair block, and a set of packets for transmitting the FEC block is referred to as an FEC packet block.

According to the present exemplary embodiment, a method for generating the FEC packet block may include generating at least one source packet for the content to be provided to a user, and generating at least one repair packet including repair symbols for repairing or recovering a payload in the at least one source packet. Then, the FEC packet block is generated so as to include the at least one source packet and the at least one repair packet.

Furthermore, according to another exemplary embodiment, a method for generating the FEC packet block may include generating at least one source packet for the content to be provided to a user, generating at least one first repair packet including first repair symbols for repairing a related payload in the at least one source packet, and generating at least one second repair packet including second repair symbols for all payloads of the at least one source packet and the at least one first repair packet. Then, an FEC packet block is generated so as to include the at least one source packet and the at least one first and second repair packets.

According to yet another exemplary embodiment, a method for generating the FEC packet block may include generating at least one source packet for the content to be provided to a user, generating at least one first repair packet including first repair symbols for repairing a related payload in the at least one source packet, and generating at least one second repair packet including second repair symbols for all payloads of the at least one source packet. Then, an FEC packet block is generated so as to include the at least one source packet and the at least one first and second repair packets.

According to an exemplary embodiment of the present invention, an FEC packet block including the source packet and the first repair packet, is referred to as a 'first FEC packet block', and an FEC packet block including the source packet and the first and second repair packets, is referred to as a 'second FEC packet block', or, alternatively, an FEC packet block including the source packet and the second repair packet is referred to as a 'second FEC packet block'. A repair block included in the first FEC packet block is referred to as a 'first repair block', and a repair block included in the second FEC packet block is referred to as a 'second repair block'.

When the source blocks in the first FEC packet block and the second FEC packet block are referred to as a first source block and a second source block, respectively, then the first source block and the second source block may include the same source symbols, or may include different source symbols. When the second FEC block is generated by adding the second repair block generated by an additional FEC encoding to the source block of the first FEC packet block, then the first source block and the second source block may include the same source symbols because a source block of the second FEC block is the same as a source block of the first FEC block. When the second source block of the second FEC block is generated by including the first source block and the first repair block, the first source block and the second source block are distinguishable from each other.

Figure 2:
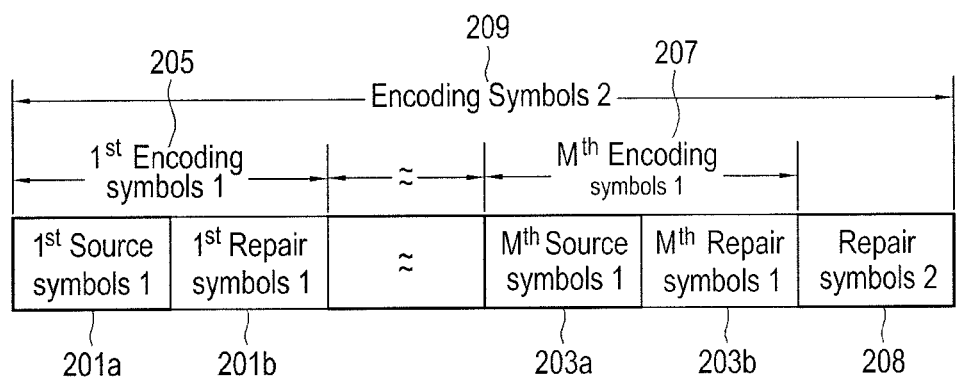
FIG. 2 shows an encoding structure, to which first Forward Error Correction (FEC) and second FEC are applied, according to an exemplary embodiment of the present invention.

FIG. 2 shows an encoding structure, to which first FEC and second FEC are applied, according to an embodiment of the present invention.

Referring to FIG. 2, M first encoding symbols 205 through 207 are generated by dividing a predetermined number of symbols into M first source symbols 201a through 203a, and performing first FEC encoding on each of the first source symbols 201a through 203a. M first encoding symbols 205 through 207 include the first source symbols 201a through 203a and their associated first repair symbols 201b through 203b.

M first encoding symbols 205 through 207 generated by the first FEC encoding, or M first source symbols 201a through 203a are used as second source symbols, and second encoding symbols 209, such as Encoding Symbols 2, as shown in FIG. 2, may include first encoding symbols 205 through 207 and second repair symbols 208, such as Repair symbols 2, as shown in FIG. 2, may be generated by performing second FEC encoding on the second source symbols. Additionally, although not shown in FIG. 2, only one of first FEC and second FEC processes may be applied selectively.

Figure 3A:
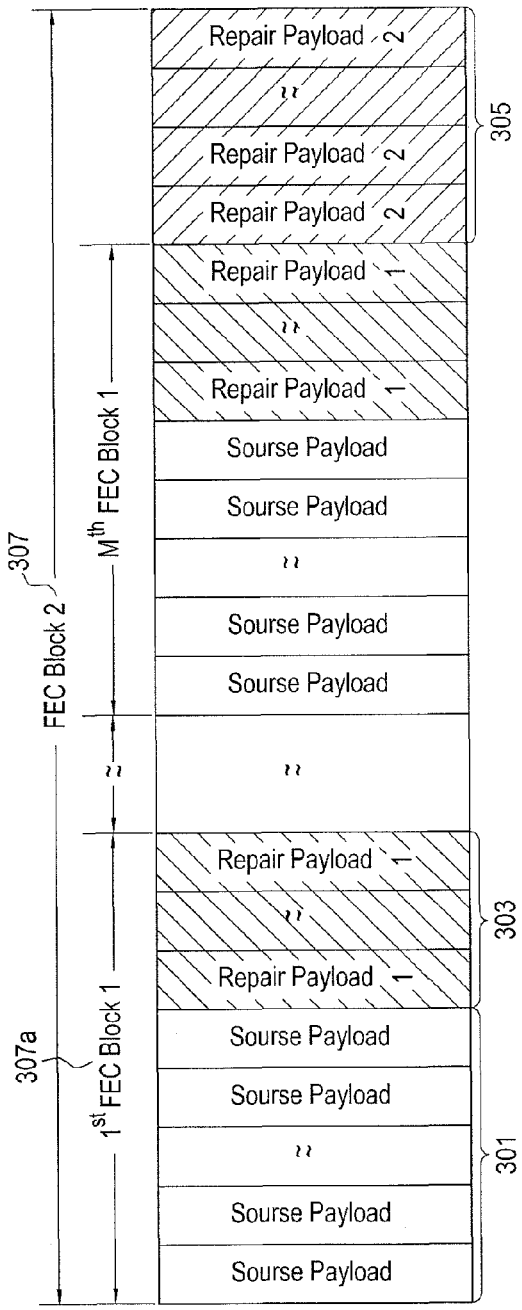
FIGS. 3A and 3B show FEC blocks and FEC packet blocks, to which first FEC and second FEC are applied, according to an exemplary embodiment of the present invention, respectively.
Figure 3B:
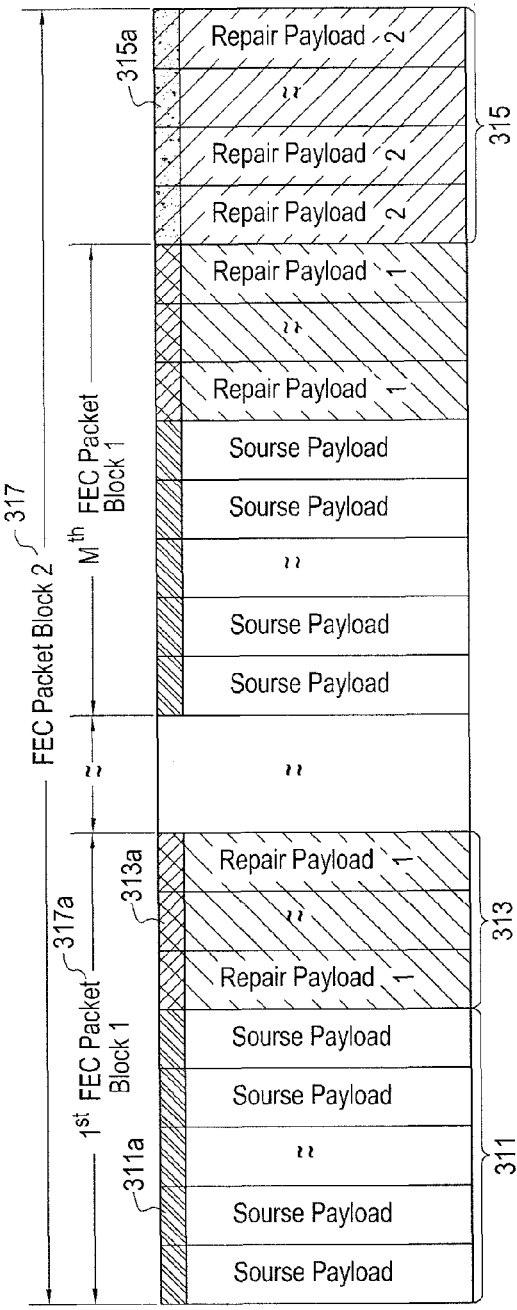

FIGS. 3A and 3B show FEC blocks and FEC packet blocks, to which a first FEC and a second FEC are applied, according to an exemplary embodiment of the present invention.

Referring to FIGS. 3A and 3B, M first FEC blocks 307a, including source payloads 301 for a source block of encoding symbols based on FIG. 2, first repair payloads 303 for a repair block, and M first FEC packet blocks 317a may be packetized by adding packet headers 311a and 313a to respective payloads 311 and 313 of each of the FEC blocks for transmission on a packet basis.

Referring to 3A, a second FEC block 307 may include the M first FEC blocks 307a, and a second repair block for transmitting at least one second repair payload 305 for the M first FEC blocks 307a when the second FEC is applied.

Referring to FIG. 3B, a second FEC packet block 317 may include the M first FEC packet blocks 317a, and a second repair block to which a packet header 315a is applied, which is for transmitting at least one second repair block 315 for the M first FEC packet blocks 317a when the second FEC is applied. Each packet includes a header and a payload. Although not shown, no FEC, only a first FEC, or only a second FEC may be applied to each packet.

When the first and second FEC encoding structures described in connection with FIGS. 3A and 3B are applied, M first FEC packet blocks 317a are generated so as to include at least one source packet including source symbols for content, and at least one first repair packet including first repair symbols for a payload of the source packet depending on the first FEC encoding. Also, a second FEC packet block 317 is generated so as to include the M first FEC packet blocks 317a and at least one second repair packet for the first FEC packet blocks depending on the second FEC encoding.

A header structure of packets included in an FEC packet block, according to an exemplary embodiment of the present invention, will be described below. In the following description, an FEC packet may be each and/or any packet included in an FEC packet block. A header of each FEC packet may include at least one of a boundary information field for first and second FEC packet blocks, a sequence number field, a boundary information field for first and second repair blocks, and a payload type information field.

The packet header may include parameter information for the first FEC, such as packet count information for the packets included in the first FEC packet block and the first source block, or packet count information for the packets included in the first source block and the first repair block. The packet header may also include parameter information for the second FEC, such as packet count information for the packets included in the second FEC packet block and the second source block, or packet count information for the packets included in the second source block and the second repair block.

The packet header may also include an FEC structure field indicating at least one of the application and non-application of the first FEC and the second FEC. According to a field value of the FEC structure field, a boundary information field for the first FEC packet block and the second FEC packet block, a sequence number field, a boundary information field for a first repair block, a payload type information field, a parameter information field for the first FEC, and a parameter information field for the second FEC may be optionally included, or may be defined differently.

TABLE 1

FEC Packet Header Format 1

Payload Type
Sequence Number
FEC Structure
FEC Block 1 Boundary Info.
FEC Block 2 Boundary Info.
Repair Block 1 Boundary Info.
Repair Block 2 Boundary Info.
Packet# for FEC Block 1(or Source Block 1)
Packet# for Source Block 1(or Repair Block 1)
Packet# for FEC Block 2(or Source Block 2)
Packet# for Source Block 2(or Repair Block2)

Table 1 shows a Header Format 1 for an FEC packet according to an exemplary embodiment of the present invention.

The header format shown in Table 1 may be a collection of information fields which may be included in a header of an FEC packet rather than being a fixed collection of information fields. Each information field in the header format may be optionally configured according to the FEC packet transmission scheme that is employed.

When only one FEC is applied, unlike when two FECs are used as shown in FIGS. 3A and 3B, the FEC packet block generation method may include generating at least one source packet for transmitting source symbols and at least one repair packet for transmitting repair symbols when FEC is applied.

TABLE 2

FEC Packet Header Format 2

Payload Type
Sequence Number
FEC Flag
FEC Block Boundary
Repair Block Boundary
Packet# for FEC Block(or Source Block)
Packet# for Source Block(or Repair Block)

Table 2 shows an FEC Packet Header Format 2 when only one FEC is applied according to an exemplary embodiment of the present invention.

Referring to Table 2, a header of each FEC packet may include at least one of a boundary information field, i.e., FEC Block Boundary, for an FEC packet block, a sequence number field, a repair block boundary information field, and a payload type information field.

The packet header may also include an information field for parameter information for FEC, such as packet count information for the packets included in an FEC packet block and a source block, or packet count information for the packets included in a source block and a repair block. The packet header may also include an FEC flag information field indicating the application or the non-application of FEC. Furthermore, according to a value of the FEC flag information field, a boundary information field for an FEC packet block, a sequence number field, a boundary information field for a repair block, a payload type information field, and a parameter information field for FEC may be optionally included.

FEC packet transmission methods of the present exemplary embodiments will be described below. A first FEC packet transmission method may include generating at least one source packet for transmitting source symbols, generating at least one first repair packet for transmitting first repair symbols when a first FEC is applied, and generating at least one second repair packet for transmitting second repair symbols when a second FEC is applied.

Each of the generated source packets and repair packets may be transmitted as described herein. A sequence number of each packet is sequentially assigned during transmission of each packet, based on the transmission order of the packet, regardless of whether it is a source packet or a repair packet. A start sequence number of a related FEC block is included in a header of each packet as FEC block boundary information, during transmission of each packet. When both the first FEC and the second FEC are applied, a start sequence number of a second FEC packet block is included in each packet header of the second FEC packet block during transmission of each packet of the second FEC packet block.

When one of the first FEC and the second FEC is selectively applied, header information of each packet includes FEC structure information during transmission of each packet. When the number of source packets or repair packets in the first FEC packet block and the second FEC packet block is variable, header information is transmitted, including packet count information and source packet count information, or source packet count information and repair packet count information, for each of the first FEC packet block and the second FEC packet block. Payload type information of each source packet is set to indicate the type, such as Audio, Video, and any other type of data, of a source payload, and payload type information of each repair packet indicates whether the payload is a first repair payload and a second repair payload.

TABLE 3

Payload Type
Sequence Number
FEC Structure
FEC Block Boundary Info.
Packet# for FEC Block 1(or Source Block 1)
Packet# for Source Block 1(or Repair Block 1)
Packet# for FEC Block 2(or Source Block 2)
Packet# for Source Block 2(or Repair Block2)

Table 3 shows a header format for an FEC packet when the first FEC packet transmission method is applied according to an exemplary embodiment.

A second FEC packet transmission method provided by an exemplary embodiment of the present invention will be described below. A payload type of a header of each packet is set to correspond to a related payload during transmission of each packet. In other words, a payload type of a packet for a source payload indicates a source payload type, such as Audio, Video, or other similar and suitable types, and a payload type of a packet for a repair payload indicates whether the repair payload is a first repair payload or a second repair payload. Sequence numbers for source packets are sequentially assigned, and independently of the sequence numbers for source packets, sequence numbers for repair packets are sequentially assigned during transmission. In addition, a sequence number for a first repair packet and a sequence number for a second repair packet are transmitted separately.

During transmission of each packet, a start sequence number of a first FEC packet block and a start sequence number of a second FEC packet block are included in a header of each packet as block boundary information for a first FEC packet block, i.e., FEC Block 1 Boundary Information, and block boundary information for a second FEC packet block, i.e., FEC Block 2 Boundary Information. Repair block boundary information is included in a header of each packet or a header of a repair packet during transmission. A start sequence number, from among first repair packets in the first FEC packet block, is included in a header of each packet or first repair packets in the first FEC packet block, and a start sequence number, from among second repair packets in the second FEC packet block, is included in a header of each packet or second repair packets in the second FEC packet block.

When one of the first FEC and the second FEC is selectively applied, FEC structure information is included in a header of each packet during transmission of each packet. When the number of source packets or repair packets in the first FEC packet block and the second FEC packet block is variable, packet count information and source packet count information, or source packet count information and repair packet count information, for each of the first FEC packet block and the second FEC packet block are included in a header of each packet during transmission of the FEC packet blocks. Furthermore, a header format used in the second FEC packet transmission method may be the same as that shown in Table 1.

A third FEC packet transmission according to another exemplary embodiment will be described below. A payload type of a header of each packet is set to correspond to a related payload during its transmission. In other words, a payload type of a packet for a source payload indicates a source payload type, such as Audio, Video, and other similar types, and a payload type of a packet for a repair payload may indicate whether the repair payload is a first repair payload or a second repair payload. Sequence numbers for source packets are sequentially assigned, and independently of the sequence numbers for the source packets, sequence numbers for repair packets are sequentially assigned during transmission. A start sequence number for the repair packets is set to start from, for example, a start sequence number of a source packet in order to be able to determine the boundary of a repair block in the FEC packet block. In other words, sequence numbers for the source packet and the repair packets in an FEC packet block are set to have a correlation with each other, thus, making it possible to determine the boundary of the repair block that includes the repair packets.

During transmission of a first FEC packet block, a start sequence number of the first FEC packet block and a start sequence number of the second FEC packet block are included in a header of each packet as block boundary information for the first FEC packet block and block boundary information for second FEC packet block. When one of the first FEC and the second FEC is selectively applied, FEC structure information is included in a header of each packet during transmission of the packet. When the number of source packets or repair packets in the first FEC packet block and the second FEC packet block is variable, then packet count information and source packet count information, or source packet count information and repair packet count information, for each of the first FEC packet block and the second FEC packet block are included in a header of each packet during transmission of each packet.

TABLE 4

Payload Type
Sequence Number
FEC Structure
FEC Block 1 Boundary Info.
FEC Block 2 Boundary Info.
Packet# for FEC Block 1(or Source Block 1)
Packet# for Source Block 1(or Repair Block 1)
Packet# for FEC Block 2(or Source Block 2)
Packet# for Source Block 2(or Repair Block2)

A header format for the third FEC packet transmission method may be the same as shown in Table 4.

A fourth FEC packet transmission method according to another exemplary embodiment of the present invention will be described below. The fourth FEC packet transmission method is applied to a case of generating at least one source packet for transmitting source symbols and generating at least one repair packet for transmitting repair symbols, when FEC is applied and when one FEC is used, unlike when the two FECs are used.

A payload type of a header of each packet corresponds to a related payload during transmission of each packet. In other words, a payload type of a packet for a source payload indicates a source payload type, and a payload type of a packet for a repair payload indicates a repair payload type. Sequence numbers for source packets are sequentially assigned, and independently from the source packets, sequence numbers for repair packets are sequentially assigned during transmission as well. A start sequence number of a related FEC packet block is included in a header of each packet as FEC block boundary information during transmission each packet.

Repair block boundary information is included in a header of each packet or a header of a repair packet during transmission of each packet or the repair packet. A start sequence number, from among repair packets in the FEC packet block, is included in a header of each packet or repair packets in the FEC packet block. When FEC is optionally applied, FEC flag information is included in a header of each packet during transmission of each packet. When the number of source packets or repair packets in an FEC packet block is variable, packet count information and source packet count information, or source packet count information and repair packet count information, for the FEC packet block are included in a header of each packet during transmission of each packet. A header format for the fourth FEC packet transmission method 4 may be the same as that shown in Table 2.

A fifth FEC packet transmission method according to another exemplary embodiment of the present invention will be described below.

A payload type of a header of each packet corresponds to a related payload during transmission of each packet. In other words, a payload type of a packet for a source payload indicates a source payload type, and a payload type of a packet for a repair payload indicates a repair payload type. Sequence numbers for source packets are sequentially assigned, and independently of the source packets, sequence numbers for repair packets are sequentially assigned during transmission of the respective packets. A start sequence number for the repair packets is set to start from, for example, a start sequence number of a source packet in order to be able to determine the boundary of a repair block in the FEC packet block. In other words, sequence numbers for a source packet and repair packets in an FEC packet block are set to have a correlation, thus making it possible to determine the boundary of a repair block including repair packets.

During transmission, a start sequence number of a related FEC packet block is stored in a header of each packet as FEC block boundary information. When FEC is optionally applied, FEC flag information is included in a header of each packet during transmission of each packet. When the number of source packets or repair packets in an FEC packet block is variable, packet count information and source packet count information, or source packet count information and repair packet count information, for the FEC packet block are stored in a header of each packet during transmission.

TABLE 5

Payload Type
Sequence Number
FEC Flag
FEC Block Boundary
Packet# for FEC Block(or Source Block)
Packet# for Source Block(or Repair Block)

A header format for the fifth FEC packet transmission method may be the same as shown in Table 5.

A sixth FEC packet transmission method according to another exemplary embodiment of the present invention will be described below.

During transmission, a sequence number of each packet is sequentially assigned based on the transmission order of the packet, regardless of whether it is a source packet or a repair packet. A start sequence number of a related FEC block is included in a header of each packet as FEC block boundary information during transmission of each packet. When FEC is optionally applied, FEC flag information is included in a header of each packet.

When the number of source packets or repair packets in an FEC packet block is variable, packet count information and source packet count information, or source packet count information and repair packet count information, for the FEC packet block are included in a header of each packet during transmission. Payload type information of each source packet indicates the type of a source payload, and payload type information of each repair packet indicates the repair payload type. Furthermore, the header format for the sixth FEC packet transmission method may be the same as that of Table 5.

According to another exemplary embodiment, instead of including block boundary information for a first FEC packet block in each packet, header information overhead of each packet may be reduced by having each packet include block boundary information for a second FEC packet block. In this case, the block boundary information for a second FEC packet block, which is included in header information of each packet, may be also set as a start sequence number of the second FEC packet block.

In the exemplary embodiments of FIGS. 3A and 3B, if a number of source packets in each source block and a number of repair packets in each repair block of M first FEC packet blocks 317*a* are the same, and their respective numbers are fixed, it is possible to determine a specific first FEC packet block, from among the M first FEC Packet Blocks 317A, to which packets included in each source block and each repair block of the M first FEC packet blocks 317*a* belong, based on the sequence number information included in the header information of each packet. Such may be determined even though only the start sequence number of a second FEC packet block is used as the block boundary information.

For example, assuming that the number of source packets included in each first FEC packet block 317*a* is 100, the number of repair packets included in each repair block is 100, and a start sequence number of a second FEC packet block is '1', then, if a sequence number of an FEC packet is '210', it may be determined that the packet is a packet belonging to a second first FEC packet block. The above scheme may be applied without distinction between source packets and repair packets. However, the present invention is not limited thereto, and the above scheme may also be applied only to the source packets, or the above scheme may not be applied to the repair packets.

Figure 4:
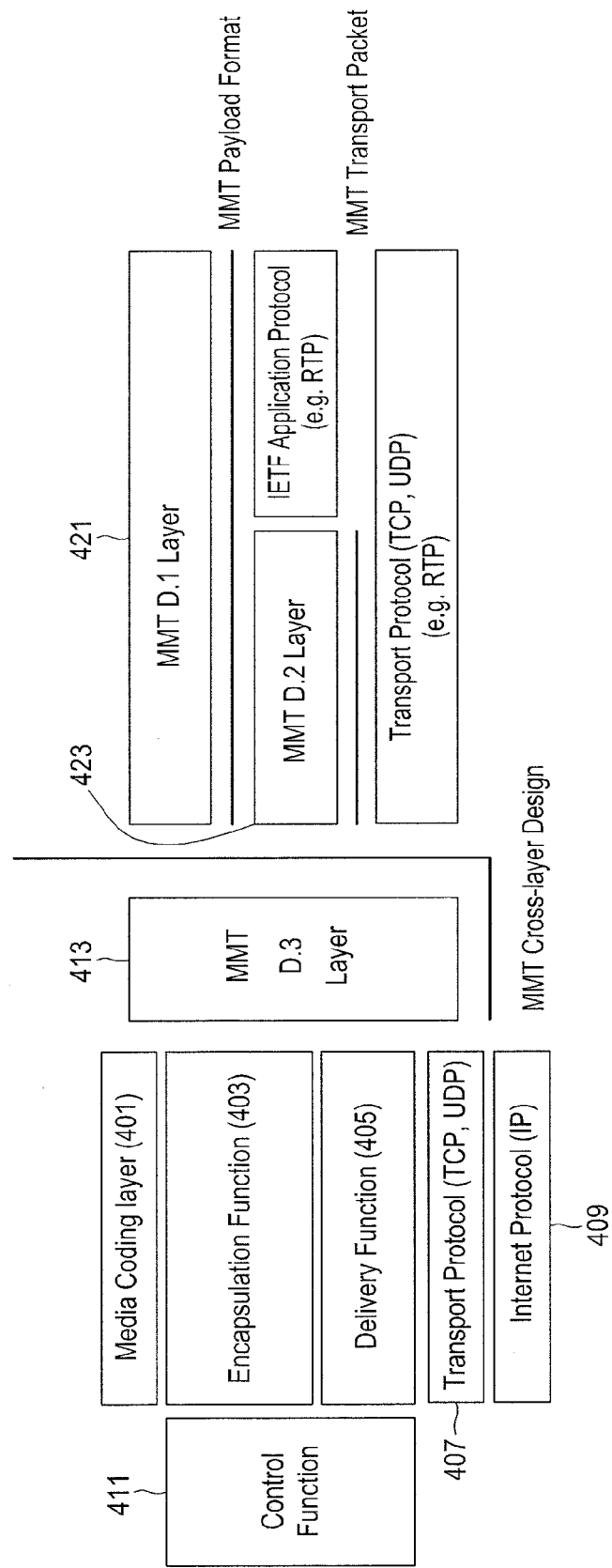
FIG. 4 shows structures of a Motion Picture Experts Group (MPEG) Media Transport (MMT) system and a transport function layer according to an exemplary embodiment of the present invention.

FIG. 4 shows structures of an MPEG media transport system and a transport function layer according to an exemplary embodiment of the present invention.

Referring to FIG. 4, a left side of FIG. 4 shows a structure of an MPEG Media Transport (MMT) system, and a right side of FIG. 4 shows a detailed structure of a transport function layer.

Audio/Video (A/V) data compressed in a media coding layer 401 is packetized in a format corresponding to a file format of the A/V data by way of an encapsulation function layer, hereinafter referred to as an E Layer, 403. A delivery function layer 405 converts the packetized A/V data into an MMT payload format, and outputs an MMT transport packet by adding an MMT transport packet header thereto, or, alternatively, outputs an RTP packet using the existing RTP protocol. The MMT transport packet header may include header information of an FEC packet in a variety of formats. Thereafter, the output packet is converted into an Internet Protocol (IP) packet in an IP stage 409 by way of a User Datagram Protocol/Transport Control Protocol (UDP/TCP) transport protocol layer 407.

Application Layer (AL)-FEC, as provided according to an exemplary embodiment of the present invention, is applied to a process of generating an MMT payload format in an MMT D.1 Layer 421 by receiving an output from the encapsulation function layer 403. When FEC is applied, a control function layer 411, if both the first FEC and the second FEC are to be applied, sends a command to the delivery function layer 405, allowing the MMT D.1 Layer 421 to generate FEC packet blocks, as shown in FIG. 3A, and allowing a MMT D.2 Layer 423 to generate FEC packet blocks, as shown in FIG. 3B, from the output of the MMT D.1 Layer 421 in the process described below. An MMT D.3 Layer 413 provides a function related to information transmission between layers. In other words, the MMT D.3 Layer 413 enables content delivery and necessary communication between layers.

For example, the MMT D.1 Layer 421 divides the data input from the E Layer 403 in units of source blocks (i.e., 6400 source payloads), each including 6400 payloads with each payload having a size of 1000 bytes, and divides the source block into 32 source sub-blocks, thus, each source sub-block includes 200 source payloads. A first FEC packet block, including 200 source payloads and 40 repair payloads, is generated by adding 50 repair payloads to each source sub-block, such as Source Block 1, by the first FEC encoding through systematic encoding. A second FEC packet block is generated by adding 320 second repair payloads to the generated 32 first FEC packet blocks, which includes 7680 payloads, or the source block, which includes 6400 payloads, by the second FEC encoding through systematic encoding.

The MMT D.2 Layer 423 performs MMT transport packetization by adding an MMT transport packet header to each payload of the second FEC packet block, which includes 6400 source payloads, 32×40 first repair payloads, and 320 second repair payloads, as shown in FIG. 3B, generated by the MMT D.1 Layer 421 and including 8000 payloads, and the MMT transport packet header format may be configured as shown in Table 1 or Table 3. When the MMT transport packet header format is configured as shown in Table 1, field values may be set as follows:

Payload type: each source payload is identified by assigning 1 byte to this field, or by assigning a value between, for example, 10h~F0h to each of source payloads, wherein a source payload and first and second repair payloads are identified by assigning a value of F1h to a first repair payload and assigning a value of F2h to a second repair payload;

Sequence number: 2 bytes are assigned to this field to sequentially assign s~s+6399 to 6400 source packets, to sequentially assign r1~r1+1279 to 1280 repair packets corresponding to 32 first repair blocks, and to sequentially assign r2~r2+319 to a second repair block including 320 repair packets, thus, if the sequence number reaches its maximum value (e.g., FFFFh), the next sequence number is 0000h;

FEC structure: 2 bits are assigned to this field, and this field is set as 11b to indicate that both the first FEC and the second FEC are applied;

Block boundary information of first FEC packet block (FEC Block 1 Boundary Info): 2 bytes are assigned to this field to set a start sequence number of each first FEC packet block, such that 's' is set in packets for a first FEC packet block, which may be the first FEC Packet Block 1, s+240 is set in packets for a first FEC packet block, which may be the second FEC Packet Block 1, . . . , and s+31*240 is set in packets for a first FEC packet block, which may be the 32nd FEC Packet Block 1, as block boundary information of first FEC packet block;

Block boundary information of second FEC packet block (FEC Block 2 Boundary Info): 2 bytes are assigned to this field to equally set block boundary information of second FEC packet block in each packet as 's';

Block boundary information of first repair block (Repair Block 1 Boundary Info): 2 bytes are assigned to this field to set a start sequence number of each first repair block, such that r1 is set in packets for a first FEC packet block, which may be the first FEC Packet Block 1, r1+40 is set in packets for a first FEC packet block, which may be the second FEC Packet Block 1, . . . , and r1+31*40 is set in packets for a first FEC packet block, which may be the 32nd FEC Packet Block 1, as block boundary information of first repair block;

Block boundary information of second repair block (Repair Block 2 Boundary Info): 2 bytes are assigned to this field to equally set block boundary information of second repair block in each packet as 'r2';

Packet number for first source block (Packet # for Source Block 1): 2 bytes are assigned to this field, which is set to '200' in each packet;

Packet number for first repair block (Packet # for Repair Block 1): 2 bytes are assigned to this field, which is set to '40' in each packet;

Packet number for second source block (Packet # for Source Block 2): 2 bytes are assigned to this field, which is set to '7680' in each packet; and Packet number for second repair block (Packet # for Repair Block 2): 2 bytes are assigned to this field, which is set to '320' in each packet for transmission of an MMT transport packet.

When the MMT transport packet header format is configured as shown in Table 3, field values may be set as follows:

Payload type: 1 byte is assigned to this field, to identify each source payload by assigning a value between 10h~F0h to source payloads, and to identify a source payload and first and second repair payloads by assigning a value of F1h to a first repair payload and assigning a value of F2h to a second repair payload;

Sequence number: 2 bytes are assigned to this field to sequentially assign s~s+7999 to 8000 FEC packets, regardless of the packet being a source packet or a repair packet;

FEC structure: 2 bits are assigned to this field, and this field is set as 11b to indicate that both the first FEC and the second FEC are applied;

FEC block boundary information (FEC Block Boundary Info): 's' is equally set in all packets of a second FEC packet block as FEC block boundary information;

Packet number for first source block (Packet # for Source Block 1): 2 bytes are assigned to this field, which is set to '200' in each packet;

Packet number for first repair block (Packet # for Repair Block 1): 2 bytes are assigned to this field, which is set to '40' in each packet;

Packet number for second source block (Packet # for Source Block 2): 2 bytes are assigned to this field, which is set to '7680' in each packet; and Packet number for second repair block (Packet # for Repair Block 2): 2 bytes are assigned to this field, which is set to '320' in each packet for transmission of an MMT transport packet.

When the MMT transport packet header format is configured as shown in Table 3, field values may be set in another method as follows:

Payload type: 1 byte is assigned to this field, to identify each source payload by assigning a value between 10h~F0h to source payloads, and to identify a source payload and first and second repair payloads by assigning a value of F1h to a first repair payload and assigning a value of F2h to a second repair payload;

Sequence number: 2 bytes are assigned to this field to sequentially assign s~s+6399 to 6400 source packets, to sequentially assign s~s+39 to packets for a first repair block, such as first Repair Block 1, from among 32 first repair blocks, to sequentially assign s+200~s+200+39 to packets for a first repair block, such as second Repair Block 1, to sequentially assign s+31*200~s+31*200+39 to packets for a first repair block, such as 32nd Repair Block 1, and to sequentially assign s~s+319 to a second repair block including 320 repair packets, however, if the sequence number reaches its maximum value (e.g., FFFFh), then the next sequence number is 0000h;

FEC structure: 2 bits are assigned to this field, and this field is set as 11b to indicate that both the first FEC and the second FEC are applied;

FEC block boundary information (FEC Block Boundary Info): a start sequence number 's' of a second FEC packet block is equally set in all packets of the second FEC packet block as FEC block boundary information;

Packet number for first source block (Packet # for Source Block 1): 2 bytes are assigned to this field, which is set to '200' in each packet;

Packet number for first repair block (Packet # for Repair Block 1): 2 bytes are assigned to this field, which is set to '40' in each packet;

Packet number for second source block (Packet # for Source Block 2): 2 bytes are assigned to this field, which is set to '7680' in each packet; and Packet number for second repair block (Packet # for Repair Block 2): 2 bytes are assigned to this field, which is set to '320' in each packet for transmission of an MMT transport packet.

When only one of first FEC and second FEC is applied, then an FEC packet block including 8000 payloads is generated by generating 1600 repair payloads in 6400 source payloads by performing FEC encoding, and the FEC packet block transmitted after adding an MMT transport packet header to each payload, wherein the MMT transport packet header format may be that as shown in Table 5. When the MMT transport packet header format is configured as in Table 5, field values may be set as follows:

Payload type: 1 byte is assigned to this field, to identify each source payload by assigning a value between 10h~F0h to source payloads, and to identify a source payload and a repair payload by assigning a value of F1h to a repair payload;

Sequence number: 2 bytes are assigned to this field to sequentially assign s~s+6399 to 6400 source packets, and to sequentially assign s~s+1599 to 1600 repair blocks, wherein, if the sequence number reaches its maximum value (e.g., FFFFh), then the next sequence number is 0000h;

FEC structure: 2 bits are assigned to this field, and this field is set as 01b or 10b to indicate that both the first FEC and the second FEC are applied, or that only one of them is applied;

FEC block boundary information (FEC Block Boundary Info): a start sequence number 's' of an FEC packet block is equally set in all packets of the FEC packet block as FEC block boundary information;

Packet number for source block (Packet # for Source Block): 2 bytes are assigned to this field, which is set to '6400' in each packet; and Packet number for repair block (Packet # for Repair Block): 2 bytes are assigned to this field, which is set to '1600' in each packet for transmission of an MMT transport packet.

In the foregoing description, the MMT transport packet header format is given as an example of the FEC packet header format according to exemplary embodiments of the present invention. However, the present invention is not limited thereto, and a header of the MMT Payload Format may serve as the FEC packet header format, as shown herein, if the MMT payload format is divided into a header ad a payload when the MMT D.1 Layer 421 generates an MMT Payload Format. In such a case, payloads in the MMT Payload Format become FEC packet payloads after undergoing FEC encoding.

A transmission apparatus, to which exemplary embodiments of the present invention may be applied, may include a transmitter for transmitting each packet in the first FEC packet block or the second FEC packet block according to a predetermined communication scheme, at least one encoder for performing the first FEC encoding and the second FEC encoding, and a controller for adding header information to each packet constituting the first FEC packet block and the second FEC packet block.

A reception apparatus, which corresponds to the transmission apparatus, includes a receiver for receiving each packet in the first FEC packet block or the second FEC packet block, according to the predetermined communication scheme, at least one decoder for performing the first FEC decoding and the second FEC decoding on the FEC scheme applied to the at least one encoder, and a controller for determining a block boundary of the first FEC packet block and the second FEC packet block by extracting the header information from each packet constituting the first FEC packet block and the second FEC packet block, and for controlling an operation of recovering a lost source packet using an associated repair packet when a source packet is lost.

The header information provided by the exemplary embodiments of the present invention is preferably construed as general FEC-related signaling information, such that it is not limited physically, and the header information is placed in front of a payload in an FEC packet.

As described above, the FEC packet generation and transmission method of the exemplary embodiments of the present invention may easily recover lost packets, despite a change in an arrival sequence of packets or the occurrence of a packet loss during delivery of content through several transmission routes in the network, thus making it possible to provide quality content and services to users.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for performing a forward error correction (FEC) encoding in a multimedia system, the method comprising:
    performing a first FEC encoding on each of source symbol blocks to generate each of FEC packet blocks and generate at least one first repair packet; and
    performing a second FEC encoding on the source symbol blocks to generate at least one second repair packet,
    wherein a repair packet of the at least one first repair packet includes information indicating a boundary of a FEC packet block corresponding to the repair packet.

2. The method of claim 1, wherein the repair packet of the at least one first repair packet includes information identifying whether or not the repair packet of the at least one first repair packet is associated with a boundary of the FEC packet block.

3. An apparatus for performing a forward error correction (FEC) encoding in a multimedia system, the apparatus comprising:
    a first FEC encoder configured to perform a first FEC encoding on each of source symbol blocks to generate each of FEC packet blocks, and generate at least one first repair packet; and
    a second FEC encoder configured to perform a second FEC encoding on the source symbol blocks to generate at least one second repair packet,
    wherein a repair packet of the at least one first repair packet includes information indicating a boundary of a FEC packet block corresponding to the repair packet.

4. The apparatus of claim 3, wherein the repair packet of the at least one first repair packet includes information identifying whether or not the repair packet of the at least one first repair packet is associated with a boundary of the FEC packet block.

\* \* \* \* \*